United States Patent [19]

Congdon

[11] 4,276,516

[45] Jun. 30, 1981

[54] THERMAL STRESS REDUCTION IN IC POWER TRANSISTORS

[75] Inventor: James S. Congdon, Santa Clara, Calif.

[73] Assignee: National Semiconductor Corporation, Santa Clara, Calif.

[21] Appl. No.: 61,158

[22] Filed: Jul. 26, 1979

[51] Int. Cl.³ ............................................. H03F 3/26
[52] U.S. Cl. .................................. 330/272; 330/289; 330/307; 357/28
[58] Field of Search ................ 307/310; 330/266, 272, 330/289, 307; 357/28

[56] References Cited

U.S. PATENT DOCUMENTS 3,631,357  12/1971  Hadley ................................. 330/266
3,729,660   4/1973  Maidique ......................... 330/307 X Primary Examiner—James B. Mullins
Attorney, Agent, or Firm—Gail W. Woodward; James A. Sheridan

[57] ABSTRACT

In an integrated circuit class B audio output device the transistors are fabricated as plural parallel connected sections. The two output transistors have their sections interdigitated so that adjacent sections are not turned on simultaneously. This leads to substantial improvements in thermal peaks within the transistors and to reduced thermal gradients across the transistors.

10 Claims, 10 Drawing Figures

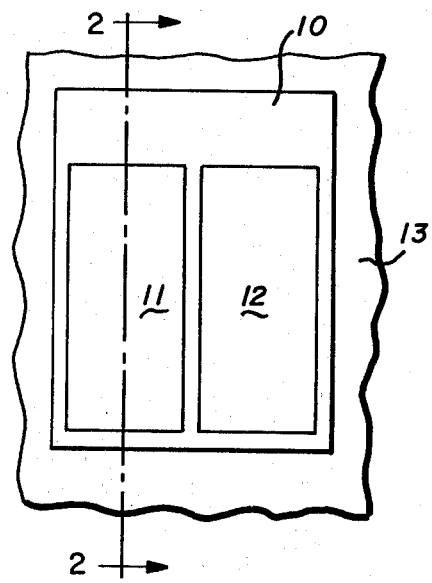
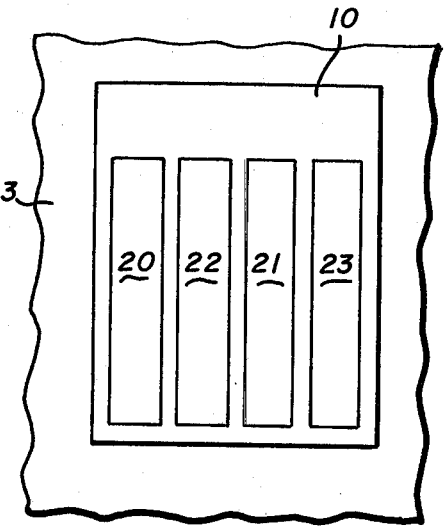
Fig_1a (PRIOR ART)   Fig_2 (PRIOR ART)   Fig_3a
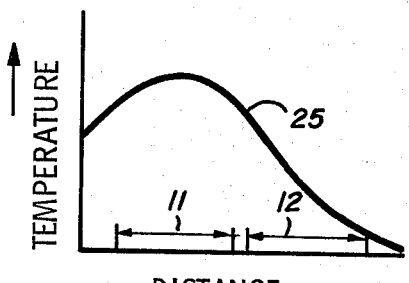
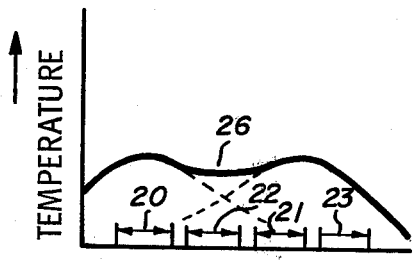
Fig_4a (PRIOR ART)   Fig_4b
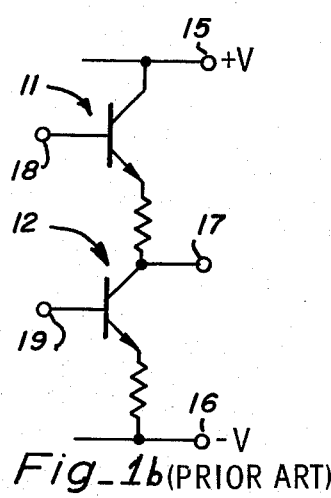
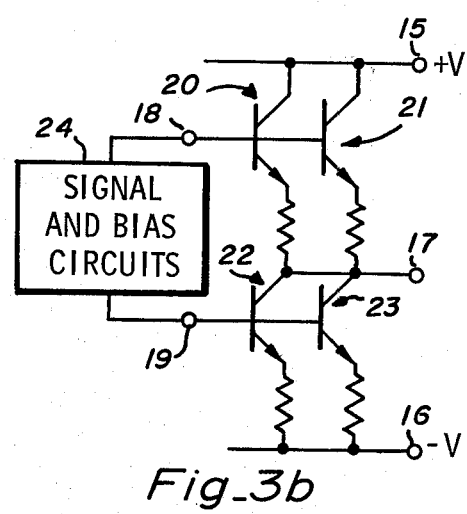
Fig_1b (PRIOR ART)   Fig_3b

THERMAL STRESS REDUCTION IN IC POWER TRANSISTORS

BACKGROUND OF THE INVENTION

Typical integrated circuit (IC) audio amplifiers deliver only a few watts of power but have proven useful in many applications. However, there is a need for high power devices that can deliver 20 watts or more for high fidelity applications. The lower power devices are not limited by the basic characteristics of the semiconductor used in fabrication but rather by other constraints that enter into IC design.

In high power IC audio amplifiers the output transistors dominate the IC chip area. Typically the back side of the chip is soldered or otherwise secured in close thermal contact with a metallic heat sink. Heat sinks such as those provided by the industry standard TO-3 or TO-220 packages have proven to be useful. Even with this construction the thermal resistance of the silicon chip is such that temperature gradients exist across the face of the power transistors and hence across the IC chip. Additionally the temperature of the material containing the output transistors rises substantially with applied signals and power. These temperature rises and gradients can not only react on the output transistors themselves, they can react adversely to other circuitry contained on the IC chip.

My copending application Ser. No. 056,489 filed July 11, 1979, is titled AMPLIFIER OUTPUT STAGE DISTORTION REDUCTION and shows some circuitry associated with a class B output stage in an IC.

SUMMARY OF THE INVENTION

It is an object of the invention to reduce the thermal stress in the power transistors associated with a high power IC.

It is a further object of the invention to reduce the temperature rise and the thermal gradients in the output transistors in a high power class B audio IC.

These and other objects are achieved by constructing the output transistors in an IC in plural sections. The output transistors have their sections interdigitated so that in class B operation adjacent sections are never on at the same time. Thus, the thermal dissipation is distributed across the IC chip and the temperature rise associated with an on transistor is reduced. This also acts to level the temperature rise so as to reduce gradients across the IC chip.

While the invention is primarily intended for high power class B audio amplifier use, the invention will be useful in any IC application using a plurality of output transistors in which the transistors do not dissipate peak power at the same time.

BRIEF DESCRIPTION OF THE DRAWING

FIG. 1a is a topographical showing of a prior art high power IC chip mounted on a heat sink;

FIG. 1b is a schematic diagram of the output transistors of the chip in FIG. 1a;

FIG. 2 is a cross section showing of FIG. 1a;

FIG. 3a is a topographical showing of the high power IC chip of the invention mounted on a heat sink;

FIG. 3b is a schematic diagram of the output transistors of the chip in FIG. 3a;

FIG. 4a is a graph showing the temperature profile across the IC of FIG. 1a with transistor 11 on;

FIG. 4b is a graph showing the temperature profile across the IC of FIG. 3a with transistor sections 20 and 21 on;

DESCRIPTION OF THE PRIOR ART

Figure 5:
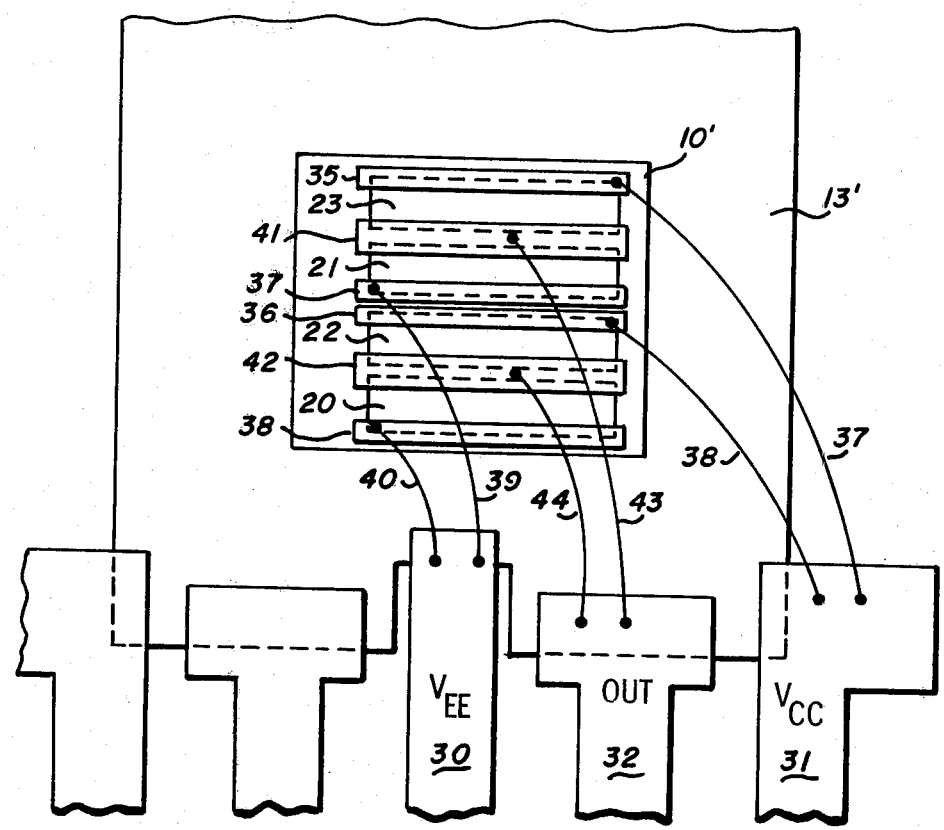
FIG. 5 shows an IC chip mounted on a TO-220 size package and connected in accordance with the invention.

FIGS. 1a and 1b illustrate the prior art. In FIG. 1a a top view is presented of a monolithic semiconductor IC chip 10. Output transistors have been created at 11 and 12. These devices are intended to dissipate substantial power and therefore tend to dominate the IC chip area. While not shown, other IC elements can be created in the chip area over transistors 11 and 12. The chip is mounted upon a heat sink 13 which is illustrated in fragmentary form.

While transistors 11 and 12 can be used in many configurations, one substantial application is in audio amplifiers. FIG. 1b shows in schematic form transistors 11 and 12 coupled together between power supply rails. At terminal 15 a +V is applied with respect to −V at terminal 16. Typically equal positive and negative voltages will be present with respect to ground and an output load (not shown) can be coupled between ground and output terminal 17. In the typical audio amplifier application the transistor base terminals 18 and 19 are biased and driven by other circuitry to provide class B operation.

For additional details on such amplifier circuit configurations reference can be made to my above-identified copending application Ser. No. 056,489 filed July 11, 1979.

While not shown, it is to be understood that each output transistor typically comprises a common emitter-base structure and a plurality of individual small area emitters. These emitters are each connected via a small ballast resistor to a common emitter connection point. Thus, as illustrated, an emitter ballast resistor is ordinarily an integral part of each output transistor. These are typically of fractional ohm value. While the above described structure is preferred, other forms of power transistor construction can be employed.

In FIG. 2 a cross section of the FIG. 1a structure is shown. Chip 10 is secured to heat sink 13 by means of solder or equivalent material at 14. The entire reverse face of chip 10 is in intimate heat exchange relationship with heat sink 13 which is constructed of high thermal conductivity materials. The power transistor 11 is therefore closely related to the heat sink. Both transistors 11 and 12 will produce heat over their entire area when they are on and most of this heat will flow directly through the chip into the heat sink. However, there is some lateral heat flow and the entire chip will tend to heat as a result of the dissipation in the power transistors.

DESCRIPTION OF THE INVENTION

FIGS. 3a and 3b illustrate the structure of a device made in accordance with the invention. Four power transistors 20-23 are built into chip 10 as shown to occupy about the same total area as power transistors 11 and 12 of FIG. 1a. The four power devices are intended to be connected as shown in FIG. 3b to create a class B output stage driven and biased by on chip circuits 24. As will be shown hereinafter, the actual connections of FIG. 3 will be achieved with conventional IC metallization and IC wire bonds to the particular IC package being used. While the class B output stage is expected to be a widely used application, the invention is intended for any situation wherein at least two power transistors are to be incorporated into an IC chip and wherein the two devices conduct alternately. Other examples of such structures are lamp or display drivers where lamps are illuminated alternately.

It will be noted that while transistors 20 and 21 are connected in parallel and therefore conduct simultaneously they are interdigitated between transistors 22 and 23 which are also parallel connected. Thus, adjacent transistors are not turned on simultaneously.

FIG. 4a is a graph showing a thermal plot of the structure of FIG. 1a. Curve 25 plots temperature vertically as a function of distance across the IC chip and relates to the condition where transistor 11 is turned on. The vertical coordinate is in arbitrary units which will be dependent in absolute value upon the IC chip dimensions, the heat sink, and the actual power dissipation. Curve 25 shows a peak at the center of the power transistor with sloping sides. This distribution results from the fact that some heat flow takes place horizontally in the IC chip. If transistor 12 is the "on" device, the curve of FIG. 4a would shift to the right with a peak over the center of transistor 12.

FIG. 4b is a graph similar to that of FIG. 4a but is taken to show the results for the structure of FIG. 3a. It is assumed that transistors 20 and 21 are on with transistors 22 and 23 off. Note that each one will dissipate half of the total power so the peak temperature will be lower. The double hump curve 26 is the composite of two curves the edges of which are shown by the dashed lines. Thus, each transistor 20 and 21 produce a single peak temperature plot but, since they are spaced apart, the double peak curve results. However, curve 26 of FIG. 4b has two substantial advantages. First the peak temperature is much less than that of FIG. 4a for the same dissipation. Second, the variation of temperature across the transistor is much smaller than that of FIG. 4a. Thus, the maximum temperature stress is reduced thereby increasing reliability. Since the gradients are also reduced, the currents to the individual transistor emitter elements are more evenly distributed.

FIG. 5 illustrates how an IC chip using the invention would be mounted in a standard package. Heat sink 13' is the heat sink portion of a TO-220 size package shown in fragmentary outline. A five-lead package version is shown. Lead 30 is the negative supply terminal labeled $V_{EE}$. Lead 31 is the positive supply terminal labeled $V_{CC}$. Lead 32 is the load terminal labeled OUT. While not shown, the other two leads are the differential amplifier input terminals.

Chip 10' contains transistors 20-23 as shown in FIG. 3a. However, a portion of the electrode metallization arrangement for the output transistors is also shown to emphasize its simplicity. Each transistor is shown having two edge located metal strips. The upper strip in each case is the commonly connected collector array. The lower strip is the emitter connection. The base connection which couples to the on chip drive circuitry is not shown. Metal strips 35 and 36 are wire bonded to lead 31 by means of wires 37 and 38 respectively. These wires are typically the conventional five-mil diameter aluminum wires ultrasonically bonded in the conventional manner.

Strips 37 and 38 are connected to lead 30 by means of wires 39 and 40 respectively. It will be noted that strips 41 and 42 are made wide enough so that adjacent transistors are series connected and wires 43 and 44 connect them to lead 32. Thus, the metallization and wire bonds of FIG. 5 are used to complete the circuit of FIG. 3b. While not illustrated in FIG. 5, after chip mounting and wire bonding is completed the assembly is encapsulated inside a block of insulating material, usually applied by transfer molding.

Figure 6:
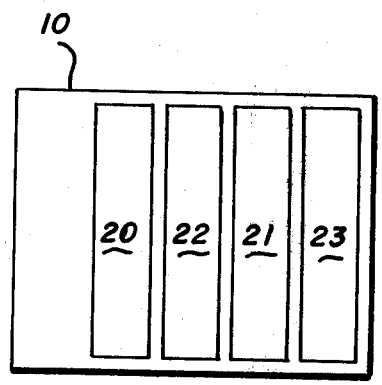
FIGS. 6 and 7 are alternative power transistor constructions in accordance with the invention.
Figure 7:
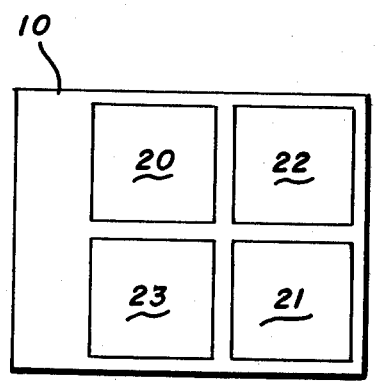

FIGS. 6 and 7 show alternative transistor configuration for that of FIG. 3a. In FIG. 6 the transistors are constructed in elongated form across the narrow IC chip dimension. In FIG. 7 the transistors are made more nearly square but are not on together. In this construction the temperature plot that is shown in FIG. 4b would be run along a diagonal passing through the center of transistor symmetry.

While the invention has been shown for an equivalent pair of transistors on an IC chip, additional transistors designed to be turned on at alternative times could be added. Thus, additional transistor sections to be connected together as spaced apart elements are contemplated. Also while two spaced-apart elements are shown interdigitated between a second pair of spaced-apart elements, the construction could be made of three or more spaced-apart elements interdigitated between another three or more spaced-apart elements. Still other alternative embodiments and equivalents within the spirit and intent of the invention will occur to a person skilled in the art. Accordingly, it is intended that the scope of the invention be limited only by the claims that follow.

I claim:

1. In an integrated circuit designed for high power operation and including at least first and second output transistors, said output transistors operating to account for most of the power dissipation in said circuit and biased so that said first and second output transistors do not dissipate their peak power simultaneously but on an alternating basis, the improvement comprising:
    fabricating said first and second output transistors each in the form of a plurality of isolated electrically interconnected sections; and
    interdigitating said sections so that adjacent sections represent respectively elements of said first and second output transistors.

2. The improvement of claim 1 wherein said integrated circuit is of monolithic construction, said first and second output transistors are created in one face thereof, and the second face is in intimate heat exchange relationship with a heat sink.

3. The improvement of claim 2 wherein said sections each comprise common base and collector regions with a plurality of separate emitter elements distributed within said common base region and said separate emitter elements each including a series resistance coupled to a common emitter connection.

4. The improvement of claim 3 in which said first and second output transistors are connected and biased to produce a class B output stage.

5. An integrated circuit including a power output stage comprising:
    a semiconductor substrate;
    means for securing one face of said substrate in heat exchange relationship with means for heat sinking;
    first and second power transistors fabricated into the opposite face of said substrate, each of said first and second transistors being composed of a plurality of individual sections interdigitated so that no two adjacent sections are part of one of said first and second power transistors; and means for interconnecting said sections into a power output stage configuration.

6. The circuit of claim 5 further including means for biasing said first and second transistors for class B operation.

7. The circuit of claim 5 wherein said first transistor comprises a first pair of sections interdigitated between a second pair of sections comprising said second transistor.

8. The circuit of claim 7 wherein said sections are of elongated rectangular form.

9. The circuit of claim 7 wherein said sections are substantially square and are arrayed to form a substantially square combination in which each transistor has its sections arrayed diagonally.

10. The circuit of claim 5 wherein said first and second transistors are of plural ballasted emitter construction.

* * * * *